United States Patent

Fukuda et al.

[11] Patent Number: 5,446,655
[45] Date of Patent: Aug. 29, 1995

[54] MULTIPLE-METER DRIVING APPARATUS

[75] Inventors: Kazuyuki Fukuda; Hiroshi Murase, both of Kyoto, Japan

[73] Assignee: Rohm Co., Ltd., Japan

[21] Appl. No.: 391,467

[22] Filed: Feb. 21, 1995

Related U.S. Application Data

[63] Continuation of Ser. No. 931,353, Aug. 18, 1992, abandoned.

[30] Foreign Application Priority Data

Aug. 28, 1991 [JP] Japan ................................. 3-217540

[51] Int. Cl.$^6$ ................................................ G06F 3/14
[52] U.S. Cl. .......................... 364/424.01; 364/424.03; 364/550; 324/140 R; 324/143; 340/870.13; 340/438; 340/459
[58] Field of Search ........................ 364/424.01, 424.03, 364/550, 556, 424.04; 340/870.19, 870.21, 870.02, 870.03, 870.11, 870.13, 870.14, 825.1, 825.11, 438, 459, 461; 324/76.39, 114, 140 R, 143

[56] References Cited

U.S. PATENT DOCUMENTS

| | | | |
|---|---|---|---|
| 4,307,455 | 12/1981 | Juhasz et al. | 364/424.04 X |
| 4,344,136 | 8/1982 | Panik | 364/424.04 |
| 4,630,043 | 12/1986 | Haubner et al. | 364/424.01 X |
| 4,862,365 | 8/1989 | Onesti | 364/424.01 |
| 4,875,041 | 10/1989 | Dannenberg | 340/870.13 |
| 4,875,042 | 10/1989 | Oku et al. | 340/870.13 X |
| 4,884,058 | 11/1989 | Ikeda | 340/461 |
| 4,991,098 | 2/1991 | Dantzler | 364/424.01 |
| 5,017,961 | 4/1991 | Hukuda | 324/143 |
| 5,053,744 | 10/1991 | Tozawa | 340/438 |

FOREIGN PATENT DOCUMENTS 0370616  5/1990  European Pat. Off. .

OTHER PUBLICATIONS

Patent Abstracts of Japan, JP-A-63 157 022, Fuji Photo Film Co., Ltd. vol. 012, No. 422 (P-783), 9 Nov. 1988.

*Primary Examiner*—Kevin J. Teska
*Assistant Examiner*—Collin W. Park
*Attorney, Agent, or Firm*—Oliff & Berridge

[57] ABSTRACT

A multiple-meter driving system intends to cut down on the amount of space needed and to reduce the manufacturing cost by providing a single controller including a processing circuit, the controller being adapted collectively to drive a plurality of meters mounted in a vehicle such as motorcar or the like. Pulse signals each having a frequency corresponding to an input signal from a vehicle speed sensor or the like in the vehicle are counted with respect to their period T by a plurality of counters. The counts are then supplied to the controller. DC signals each corresponding to an input from a fuel sensor or the like are converted into digital signals by an A/D converter, which are also supplied to the controller. The processing circuit in the controller time-shares these input signals so as to perform operations of 1/T, sine and cosine. The results are again supplied back to the controller which in turn directs them to pulse width modulating circuits corresponding to the respective meters to be indicated. Since the respective meters are driven on a time-sharing basis, the single controller including the processing circuit can drive the meters collectively.

14 Claims, 4 Drawing Sheets

MULTIPLE-METER DRIVING APPARATUS

This is a Continuation of application Ser. No. 07/931,353 filed Aug. 18, 1992, now abandoned.

BACKGROUND OF THE INVENTION

1. Field of the Invention

The present invention relates to a multiple-meter driving apparatus and more particularly to such an apparatus that collectively drives a speedometer, a tachometer, a fuel meter, a water temperature meter and other meters, all of which are used in vehicles such as motorcars and the like.

2. Description of the Related Art

Vehicles such as motorcars and the like use various meters such as a speedometer, a tachometer, a fuel meter, a water temperature meter, an oil pressure meter and so on. These meters are adapted to process a detection signal from the respective one of numerous sensors mounted on an engine, drive shaft, fuel tank or the like and to indicate a physical amount by moving the meter by an angular displacement corresponding to the input. The sensor usually used in the speedometer or tachometer is one that outputs pulse signals having frequencies which are variable depending on the vehicle speed or engine revolution speed. The frequencies in these pulse signals are counted to provide a meter angle signal. On the other hand, the sensor generally used in the fuel meter or oil pressure meter is of such a type that it outputs DC signals having voltage values (or current values) which correspond to the amount of fuel or water temperature level. The DC signals are then converted into digital values which in turn provide meter angle signals. The resulting meter angle signal is applied to two coils Ls and Lc which are disposed perpendicular to each other, as shown in FIG. 1. The coils Ls and Lc then create a magnetic field which in turn rotates a magnet M disposed therein. The magnet M is connected, for example, with a speedometer as shown in FIG. 2. The rotation of the magnet M will cause the angular displacement of the speedometer.

A meter which gives an indication corresponding to the magnitude of electric current applied to two perpendicular coils Ls and Lc is called a "cross-coil meter".

The conventional meter driving devices which provide meter indications based on pulse and DC signals from the respective sensors comprise a processor or controller for processing the detection signals from the sensors corresponding to the speedometer, tachometer, fuel meter, water temperature meter and other meters.

There are thus problems in that as the number of meters to be mounted in a vehicle-increases, the corresponding number of driving devices must be mounted in the vehicle, thereby increasing the necessary space and also the manufacturing cost.

SUMMARY OF THE INVENTION

It is therefore an object of the invention to provide a multiple-meter driving system which can collectively drive a plurality of meters such as a speedometer, tachometer, fuel meter, water temperature meter and other meters.

To this end, the present invention provides a multiple-meter driving apparatus comprising a plurality of counters each for counting the period of a pulse signal having a frequency corresponding to a first type of input, a plurality of A/D converters each for receiving a DC signal corresponding to a second type of input and converting the DC signal into a digital signal, and a controller, for receiving the signals from the counters and A/D converters, which includes processing means for time-sharing the received signals at a predetermined time interval to form meter angle signals which in turn are sequentially outputted to drive means.

As will be apparent from the foregoing, the multiple-meter driving system of the present invention provides a meter angle signal obtained by time-sharing pulse signals having their frequencies corresponding to inputs from the respective sensors or DC signals corresponding to inputs from the respective sensors.

More particularly, each of the counters counts the period of a pulse signal having its frequency corresponding to the first type of input to be supplied to such a meter as a speedometer or a tachometer. Each of the A/D converters converts a DC signal corresponding to the second type of input to be supplied to such a meter as a fuel meter or a water temperature meter into a digital signal. These signals will be outputted to the controller.

After being received by the controller, the signals are sequentially received and time-shared by the processing circuit to form meter angle signals. These meter angle signals are sequentially outputted to the respective meters.

In such a manner, a plurality of meters such as a speedometer, a tachometer, a fuel meter, a water temperature meter and other meters will be sequentially driven at a predetermined time interval. Therefore, a single controller or processing circuit can drive a plurality of meters.

DETAILED DESCRIPTION OF THE PREFERRED EMBODIMENTS

Figure 1:
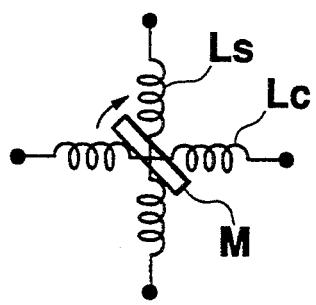
FIG. 1 is a view schematically showing the coil arrangement of a cross-coil meter.
Figure 2:
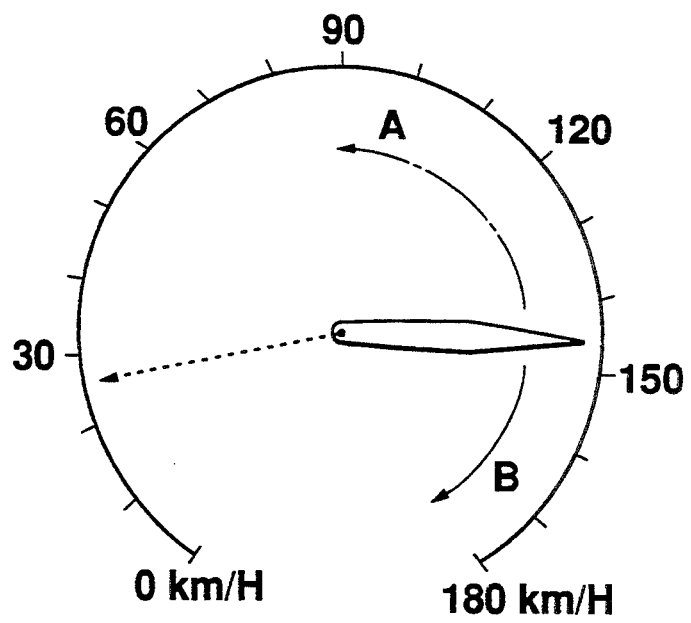
FIG. 2 is a view showing a meter indicator in the cross-coil meter.

The present invention will now be described in connection with one preferred embodiment thereof illustrated in the drawings.

Figure 3:
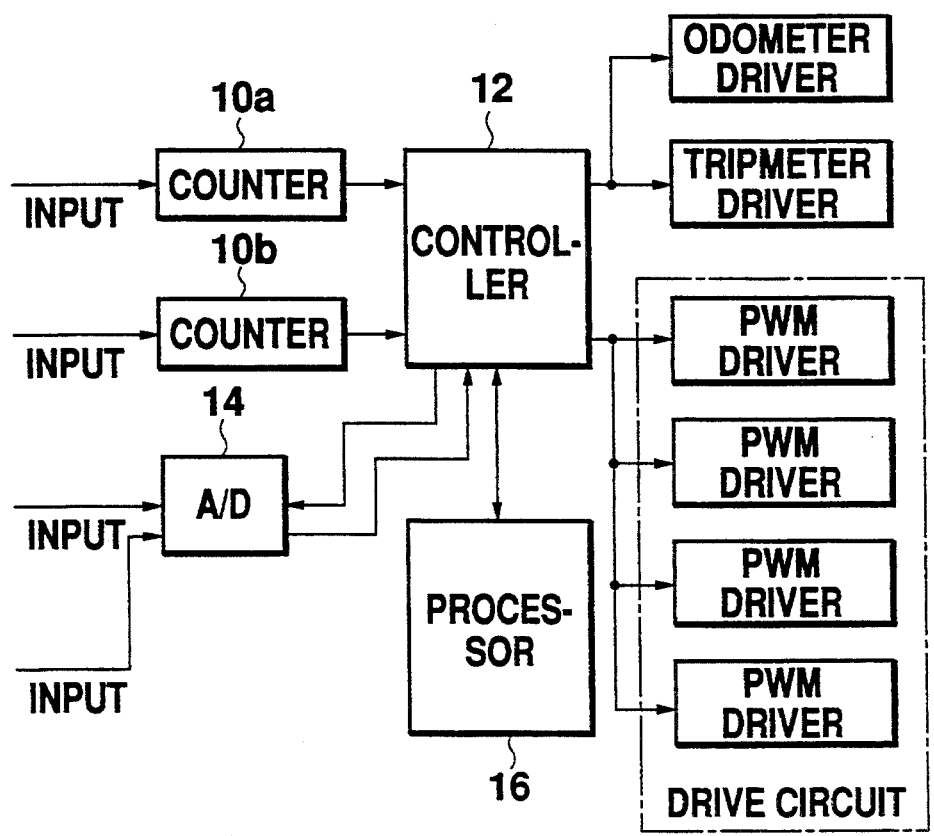
FIG. 3 is a block diagram of one embodiment of a multiple-meter driving system constructed in accordance with the present invention.
Figure 4:
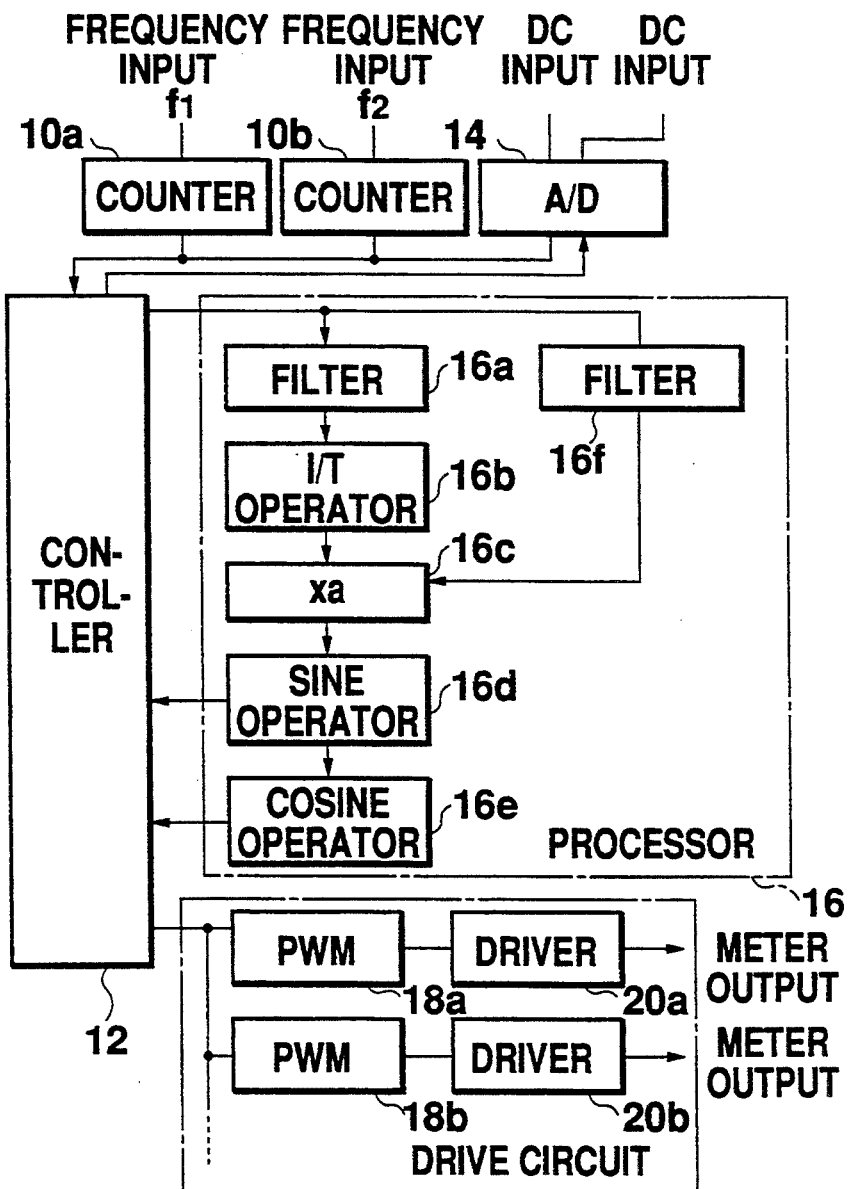
FIG. 4 is a block diagram of the details of a processing circuit usable in the controller of FIG. 3.

Referring to FIGS. 3 and 4, pulse signals are outputted respectively from speed and revolution sensors and have frequencies corresponding to the levels of vehicle speed and engine revolution speed which are sensed by the sensors. These pulse signals are inputted to counters 10a and 10b, respectively. Each of the counters 10a and 10b receives a reference clock from a reference clock generator (not shown). The period T of the inputted pulse signals is counted by this reference clock. The counts are supplied to a controller 12 which comprises a four-bit microcomputer. On the other hand, DC signals are outputted respectively from fuel and water-temperature sensors and have voltage values corresponding to the residual fuel quantity and water temperature. These DC signals are inputted to an A/D converter 14 wherein they are converted into digital signals. The digital signals are then fed to the controller 12. The controller 12 comprises a processing circuit 16 which time-shares the inputted signals to produce meter angle signals. The meter angle signals are sequentially outputted to a drive circuit for driving the respective meters.

Figure 5:
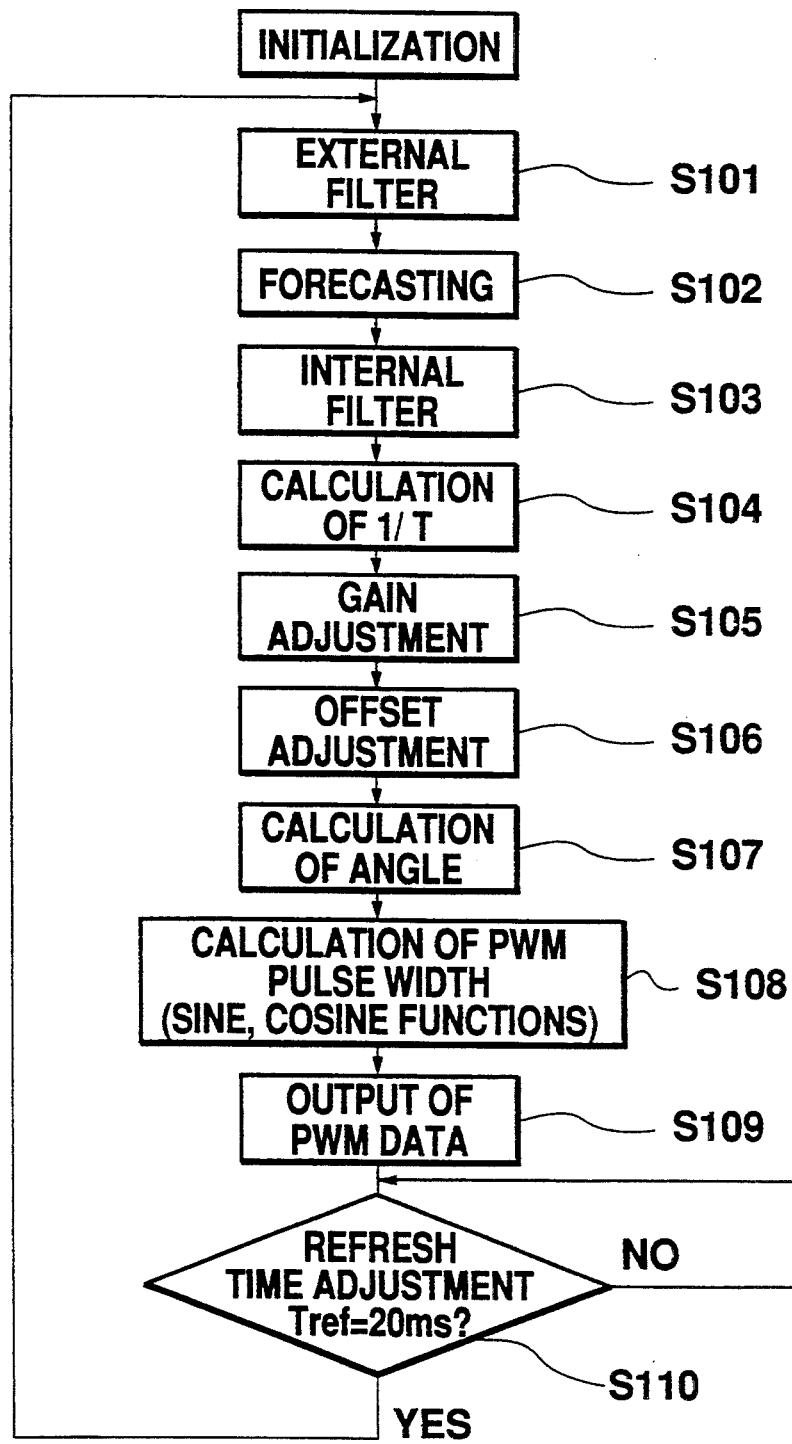
FIG. 5 is a flowchart of the operation of the multiple-meter driving system shown in FIGS. 3 and 4.

Referring particularly to FIGS. 4 and 5, the controller 12 and processing circuit 16 will be described in more detail with respect to their operations.

In FIG. 4, the controller (4-bit microcomputer) 12 receives period values T1 and T2 of pulse signals from the counter 10a and 10b and also digital signals from the A/D converter 14, the digital signals being variable dependent on the residual fuel quantity and water temperature. The controller 12 takes and supplies these signals to the processing circuit 16 every 20 msec. More particularly, the controller 12 first takes the period T1 from the counter 10a and then feeds it to a filter 16a in the processing circuit 16. The filter 16a is a low-pass filter for removing only high-frequency components from the period T1 signal which has been provided from the controller 12 (S101–S103). The filtered signal is then supplied from the filter 16a to a 1/T operator 16b. The 1/T operator calculates the inverse number 1/T of the supplied period T1 so as to calculate the frequency f1 of the original pulse signal (S104). The resulting frequency f1 is then fed to an amplifier 16c wherein the frequency f1 is adjusted by a gain a from a ROM contained within the controller 12 or the processing circuit (S105). This causes a meter indication to be provided in response to the magnitude of input for every type of vehicle in which the meter is mounted. In the illustrated embodiment, the adjustment of the gain will be performed in accordance with the following equation:

$$\theta x = 720 \times f1/fr \times a/2048 + \theta o$$

where $\theta x$ is an angle of deflection; f1 is a calculated frequency; fr is a selected range of frequency (including 250 Hz, 500 Hz, 1000 Hz and 2000 Hz); a is the aforementioned gain using 11-bit data which represents $1 \leq a \leq 2047$; and $\theta o$ is an adjusted offset angle. After adjusted with respect to the gain, the frequency f1 is further offset adjusted (S106) and supplied to a sine operator 16d and a cosine operator 16e. Each of the operators 16d and 16e calculates sine and cosine signals to be supplied to the cross-coil meter so that it will indicate an angle corresponding to the frequency f1 (S107–S108). The calculated sine and cosine signals are again supplied back to the controller 12. The controller 12 transfers these sine and cosine signals to the respective one of a number of pulse width modulating (PWM) circuits 18a, 8b, ... which are provided for each of the meters to be driven (S109).

After the signal from the counter 10a has been processed and supplied to the corresponding PWM circuit, the controller 12 then takes the period signal T2 from the counter 10b. The period signal T2 is supplied to the processing circuit 16 wherein it is similarly processed to output a meter angle signal to the corresponding PWM circuit (S110).

In such a manner, the period signals can be sequentially taken from the counters 10a and 10b and time-shared by the controller 12 to provide meter indications.

A digital signal is taken from the A/D converter 14 and supplied to a filter 16f by the controller 12. The filter 16f is also a low-pass filter for removing high-frequency components from the digital signal, as in the filter 16a. After the high-frequency components have been removed from the digital signal, the latter is then supplied directly to the amplifier 16c without passing through the 1/T operator 16b, unlike the aforementioned period signal. At the amplifier 16c, the digital signal is adjusted with respect to the gain thereof. Thereafter, sine and cosine signals are similarly calculated and supplied to the controller 12 which in turn provides the sine and cosine signals to the corresponding PWM circuit.

Subsequently, the controller 12 instructs the A/D converter 14 so that another DC signal is selected. The same process as described above is performed to output a meter drive signal to the corresponding PWM circuit.

When 20 msec. elapses after all the inputted pulse and DC signals have been processed, the outputs of all the PWM circuits are simultaneously provided to the respective drivers 20a, 20b, ... to cause the cross-coil meters to perform their meter indications. During the next cycle through 20 msec., the same process is again made to update the PWM signals to be supplied for providing new meter indications in the meters (S110).

In such a manner, detection signals from various sensors are supplied to the controller which in turn time-shares them to form meter angle signals. The meter angle signals are sequentially provided to the meters. Thus, a single controller can collectively control a plurality of meters. This saves on the space needed to contain the multiple-meter driving system and also reduces the manufacturing cost.

Although the embodiment has been described as to the multiple-meter driving system handling two different pulse signals and two different DC signals, the number of pulse or DC signals may be selected suitably depending on the number of meters to be used in the vehicle.

What is claimed is:
1. A multiple-meter driving apparatus comprising:
 (a) a plurality of counter means, each counter means for receiving a pulse signal having a frequency corresponding to a first type of input from a first-type sensor, counting a period T of said pulse signal, and outputting a period signal;
 (b) A/D converter means for receiving a DC signal corresponding to a second type of input from a second-type sensor and converting said DC signal into a digital signal;
 (c) control means for sequentially inputting, during each predetermined time-sharing interval, the period signal from each of said plurality of counter means and said digital signal from said A/D converter means, said control means including processing means for time-share processing each of said input signals input exactly once during the predetermined time-sharing interval to form a corresponding meter angle signal and sequentially outputting the meter angle signal corresponding to each of said input signals; and
 (d) drive means for sequentially receiving the meter angle signals during the predetermined time interval and driving a plurality of meters based on the meter angle signals outputted from said control means during the predetermined time interval, each meter angle signal driving a corresponding one of the plurality of meters.

2. A multiple-meter driving apparatus as defined in claim 1, wherein said first type of input represents at least one of a speed of a vehicle and a rotational speed of an engine, and said second type of input represents at least one of a residual fuel quantity and a cooling water temperature of the vehicle.

3. A multiple-meter driving apparatus as defined in claim 1, wherein said processing means comprises:

a first low-pass filter for removing high-frequency components in the period signals output from said plurality of counter means;

a second low-pass filter for removing high-frequency components in the digital signal outputted from said A/D converter means;

a 1/T operator for calculating and outputting an inverse period signal from the period signal output from said first low-pass filter;

an amplifier for amplifying one of the inverse period signal of said 1/T operator and said filtered digital signal output by second low-pass filter with a given gain;

a sine operator for calculating a sine component of the signal from said amplifier to form a sine signal and outputting said sine signal to said control means; and a cosine operator for calculating a cosine component of the signal from said amplifier to form a cosine signal and outputting said cosine signal to said control means.

4. A multiple-meter driving apparatus as defined in claim 3, wherein said drive means comprises a plurality of driver circuits, each driver circuit comprising a modulating circuit and a driver, said modulating circuit modulating a pulse width of one of the meter angle signals corresponding to one of the period signals and the digital signal, said meter angle signal comprising the sine and cosine signals from said control means, the driver driving one of the plurality of meters based on the modulated signals from said modulating circuit.

5. A multiple-meter driving apparatus as defined in claim 4, wherein, during each predetermined time interval:

each of the plurality of period signals and the digital signal are input in sequence as a current input signal;

the input signal is processed by the control means to form corresponding sine and cosine signals; and the sine and cosine signals corresponding to the current input signal are output to a corresponding one of the drive circuits, the drive circuit driving a gauge corresponding to the current input signal based on the corresponding sine and cosine signals.

6. A multiple-meter driving apparatus as defined in claim 1, wherein each first-type sensor comprises one of at least a vehicle speed sensor and an engine speed sensor.

7. A multiple-meter driving apparatus as defined in claim 1, wherein the second type sensor comprises one of at least a fuel amount sensor and an engine temperature sensor.

8. A multiple-meter driving apparatus as defined in claim 1, wherein the A/D converter means receives a plurality of the DC signals, each DC signal output from one of a plurality of second-type sensors, the A/D converter means converting one of the plurality of the DC signals at a time.

9. A time-sharing method for driving a plurality of meters using a multiple-meter driving apparatus, comprising the steps of:

(a) inputting pulse signals from at least one pulse type sensor;

(b) inputting DC signals from at least one DC-type sensor;

(d) converting each DC signal to a corresponding digital signal;

(e) inputting one of said period signals and digital signals as a current input signal;

(f) converting the current input signal to corresponding sine and cosine signals;

(g) outputting the sine and cosine signals corresponding to the current input signal to a corresponding one of a plurality of driving circuits, the corresponding driving circuit comprising a modulating circuit and a driver, the driver driving a corresponding meter;

(h) modulating the sine and cosine signals to form pulse width modulated signals;

(i) driving the corresponding meter in response to the pulse width modulated signals; and (j) repeating steps (e)–(i) for each one of the period signals and digital signals, exactly once during a predetermined time-sharing interval.

10. The method of claim 9, wherein steps (a)–(j) are repeated for each of a plurality of the predetermined time intervals.

11. The method of claim 9, wherein the current input signal is a period signal.

12. The method of claim 11, wherein the current input signal converting step comprises the steps of:

filtering the current input signal;

determining an inverse period signal from the current input signal;

amplifying the inverse period signal;

determining the sine signal from the amplified signal; and determining the cosine signal from the amplified signal.

13. The method of claim 9, wherein the current input signal is a digital signal.

14. The method of claim 13, wherein the current input signal converting step comprises the steps of filtering the current input signal;

amplifying the filtered signal;

determining the sine signal from the amplified signal; and determining the cosine signal from the amplified signal.

* * * * *